(12) United States Patent
Batey (10) Patent No.: US 7,183,786 B2
(45) Date of Patent: Feb. 27, 2007

(54) MODIFYING A SEMICONDUCTOR DEVICE TO PROVIDE ELECTRICAL PARAMETER MONITORING

(75) Inventor: Robert M. Batey, Eagle, ID (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 245 days.

(21) Appl. No.: 10/379,178

(22) Filed: Mar. 4, 2003

(65) Prior Publication Data

US 2004/0174179 A1    Sep. 9, 2004

(51) Int. Cl.
*G01R 31/28* (2006.01)
*H01L 21/66* (2006.01)
(52) U.S. Cl. .......................................... 324/765; 438/17
(58) Field of Classification Search ................ 324/755, 324/765, 754, 158.1; 438/14, 17, 18, 4
See application file for complete search history.

(56) References Cited

U.S. PATENT DOCUMENTS

| | | | |
|---|---|---|---|
| 5,528,157 A | * | 6/1996 | Newberry et al. .......... 324/754 |
| 5,763,947 A | | 6/1998 | Bartley |
| 5,770,964 A | | 6/1998 | Suma |
| 5,895,230 A | * | 4/1999 | Bartley .......................... 438/4 |
| 6,016,058 A | | 1/2000 | Sussman et al. |
| 6,239,604 B1 | | 5/2001 | Van Lammeren et al. |
| 6,263,563 B1 | | 7/2001 | Sasov |
| 6,512,289 B1 | | 1/2003 | Elward |
| 2003/0122255 A1 | | 7/2003 | Bartley |

OTHER PUBLICATIONS

National Semiconductor article, entitled "National Semiconductor LVDS Products—National's Innovative LVDS Solutions for Backplane & Cable Interconnect"; pp. 1-8; Oct. 2001.
Combined Great Britain Search and Examination Report mailed Aug. 6, 2004 (3 pgs.).
German Office Action mailed Apr. 3, 2006 (5 pgs.).

* cited by examiner

Primary Examiner—Ernest Karlsen (57) ABSTRACT

A method of modifying a semiconductor device to provide electrical parameter monitoring. The device includes a semiconductor die and a package substrate. The substrate includes a conductive plane. The die is connected to the plane via a plurality of connection structures. The method includes disconnecting a first one of the connection structures from the plane, and connecting the first connection structure to an external package connection, thereby providing a capability to monitor an electrical parameter of the die via the external package connection.

18 Claims, 7 Drawing Sheets

MODIFYING A SEMICONDUCTOR DEVICE TO PROVIDE ELECTRICAL PARAMETER MONITORING

THE FIELD OF THE INVENTION

The present invention generally relates to semiconductor devices, and more particularly to modifying a semiconductor device to provide electrical parameter monitoring.

BACKGROUND OF THE INVENTION

Two levels of interconnection structures are typically used in semiconductor chips with a substrate. A first level of interconnection is typically provided between a semiconductor die and a package substrate, and then a second level of interconnection is provided between the substrate and a printed circuit board.

One technique for packaging a semiconductor die is to connect pads of the die to the substrate with wires (i.e., wire bonding). Electrical conductors typically extend through the substrate to an opposing surface thereof, and connect to an array of solder balls, which are typically spaced apart from each other on a much larger scale than the pads on the semiconductor die.

The package substrate in some semiconductor chips includes one or more power planes and/or one or more ground planes. These planes are each typically connected to multiple pads of the die and to multiple solder balls.

In some semiconductor chips, dedicated voltage monitoring connections are provided inside the die, and are connected to dedicated voltage monitoring pads on the die. Thus, in addition to power pads, ground pads, and other miscellaneous pads (e.g., signal or data pads), these chips include die pads specifically designed for voltage monitoring. The dedicated pads for voltage monitoring are typically different in construction than other pads (e.g., power pads and ground pads). The dedicated pads are typically designed to minimize wasted space. Providing dedicated pads for voltage monitoring requires a significant amount of design effort. Some semiconductor chips do not provide any voltage monitoring functionality.

SUMMARY OF THE INVENTION

One form of the present invention provides a method of modifying a semiconductor device to provide electrical parameter monitoring. The device includes a semiconductor die and a package substrate. The substrate includes a conductive plane. The die is connected to the plane via a plurality of connection structures. The method includes disconnecting a first one of the connection structures from the plane, and connecting the first connection structure to an external package connection, thereby providing a capability to monitor an electrical parameter of the die via the external package connection.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
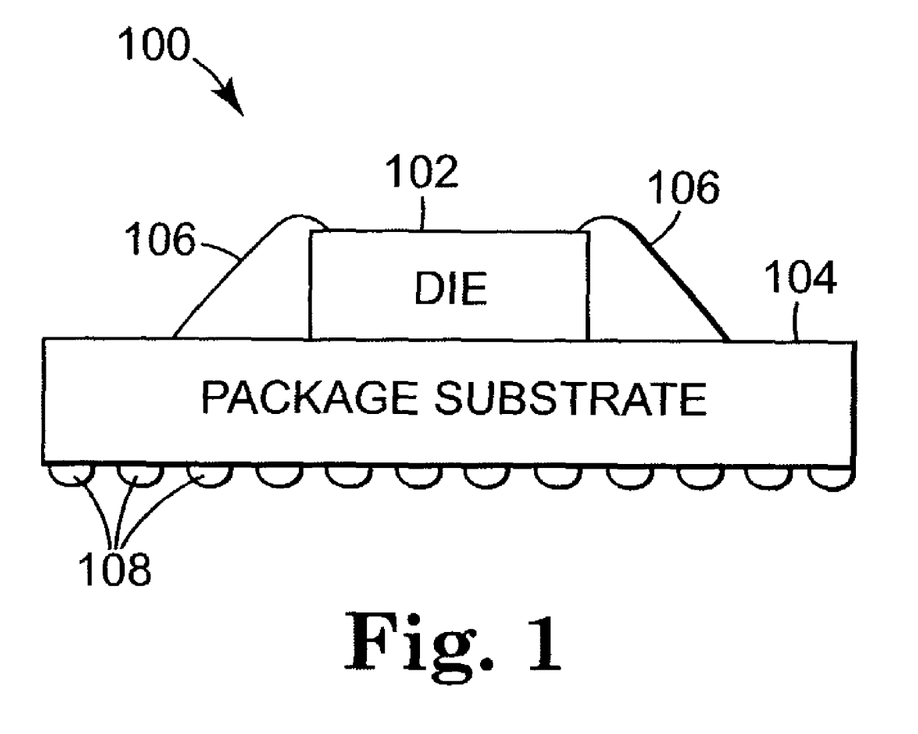
FIG. 1 illustrates a side view of a semiconductor device suitable for implementing one embodiment of the present invention.

FIG. 1 illustrates a side view of a semiconductor device 100 suitable for implementing one embodiment of the present invention. Semiconductor device 100 includes semiconductor die 102 and package substrate 104. Semiconductor die 102 is positioned on a top surface of substrate 104, substantially near the center of the top surface of the substrate 104. A plurality of internal package interconnection structures 106 connect die 102 and substrate 104. In one embodiment, interconnection structures 106 are bond wires. A plurality of external package interconnection structures 108 are formed on a bottom surface of substrate 104. In one embodiment, interconnection structures 108 are solder balls configured in a ball grid array (BGA). In one form of the invention, substrate 104 is a multi-layer substrate with a plurality of internal conductive planes (e.g., a ground plane and one or more power planes).

Figure 2:
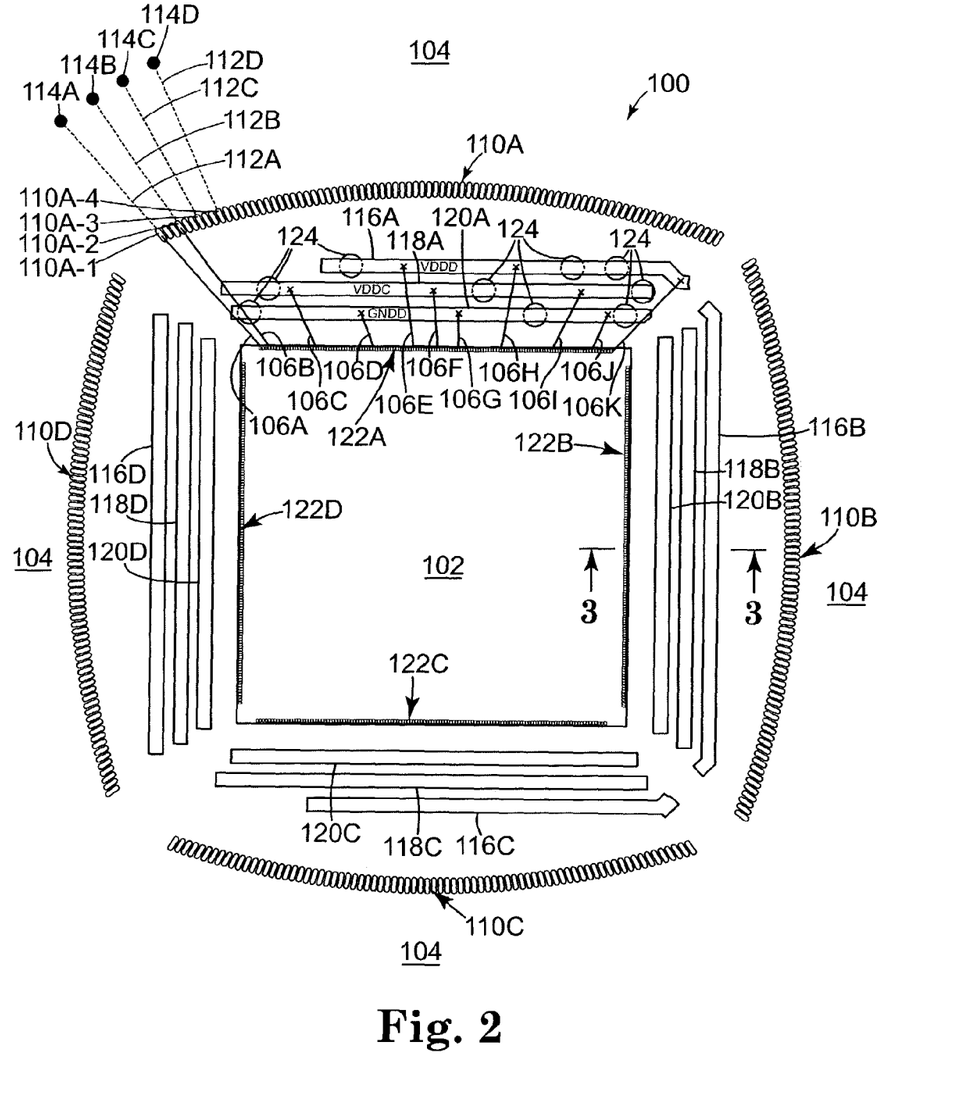
FIG. 2 illustrates a top view of the semiconductor device shown in FIG. 1 according to one embodiment of the present invention.

FIG. 2 illustrates a top view of the semiconductor device 100 shown in FIG. 1. Four metal ground interconnects 120A–120D (collectively referred to as ground interconnects 120), four metal VDDC power supply interconnects 118A–118D (collectively referred to as VDDC power supply interconnects 118), four metal VDDD power supply interconnects 116A–116D (collectively referred to as VDDD power supply interconnects 116), and four sets of metal substrate signal pads 110A–110D (collectively referred to as substrate signal pads 110) are formed on the top surface of substrate 104.

Four sets of metal die pads 122A–122D (collectively referred to as die pads 122) are formed on the top surface of die 102, substantially near the four edges of the die 102. The die pads 122 are bonded to substrate 104 via bond wires 106A–106K (collectively referred to as bond wires 106). The die pads 122 include power die pads, ground die pads, and signal die pads. The power die pads are connected to power supply connections within the die 102, the ground die pads are connected to ground connections within the die 102, and the signal die pads are connected to various circuits within the die 102.

Power die pads 122 are connected to one of the power supply interconnects 116 or 118 via bond wires 106. As shown in FIG. 2, bond wires 106E, 106H, and 106K connect three power die pads 122 to VDDD power supply interconnect 116A, and bond wires 106C, 106F, and 106I connect three power die pads 122 to VDDC power supply interconnect 1118A. Ground die pads 122 are connected to one of the ground interconnects 120 via wire bonds 106. As shown in FIG. 2, bond wires 106D, 106G, and 106J connect three ground die pads 122 to ground interconnect 120A. Signal die pads 122 are connected to the substrate signal pads 110 via bond wires 106. As shown in FIG. 2, bond wires 106A and 106B connect two signal die pads 122 to substrate signal pads 110A-1 and 110A-2, respectively.

To simplify the illustration, only eleven bond wires 106 are shown in FIG. 2, which connect various ones of the die pads 122A to ground interconnect 120A, power supply interconnects 116A and 118A, and substrate signal pads 110A. In an actual implementation according to one embodiment, additional die pads 122A are similarly connected to one of the interconnects 116A, 118A, 120A, or one of the substrate signal pads 110A. Similarly, the die pads 122B are connected to one of the interconnects 116B, 118B, 120B, or one of the substrate signal pads 110B; the die pads 122C are connected to one of the interconnects 116C, 118C, 120C, or one of the substrate signal pads 110C; and the die pads 122D are connected to one of the interconnects 116D, 118D, 120D, or one of the substrate signal pads 110D.

Substrate signal pads 110A include substrate signal pads 110A-1, 110A-2, 110A-3, and 110A-4, which are connected by conductive traces 112A–112D (collectively referred to as traces 112) to vias 114A–114D (collectively referred to as vias 114), respectively. Although only four traces 112 and four vias 114 are shown in FIG. 2 to simplify the illustration, in an actual implementation according to one embodiment, additional substrate signal pads 110A–110D are connected by traces 112 to vias 114. Each via 114 extends through substrate 104 to one of the solder balls 108 (shown in FIG. 1) on the bottom surface of the substrate 104.

Figure 3:
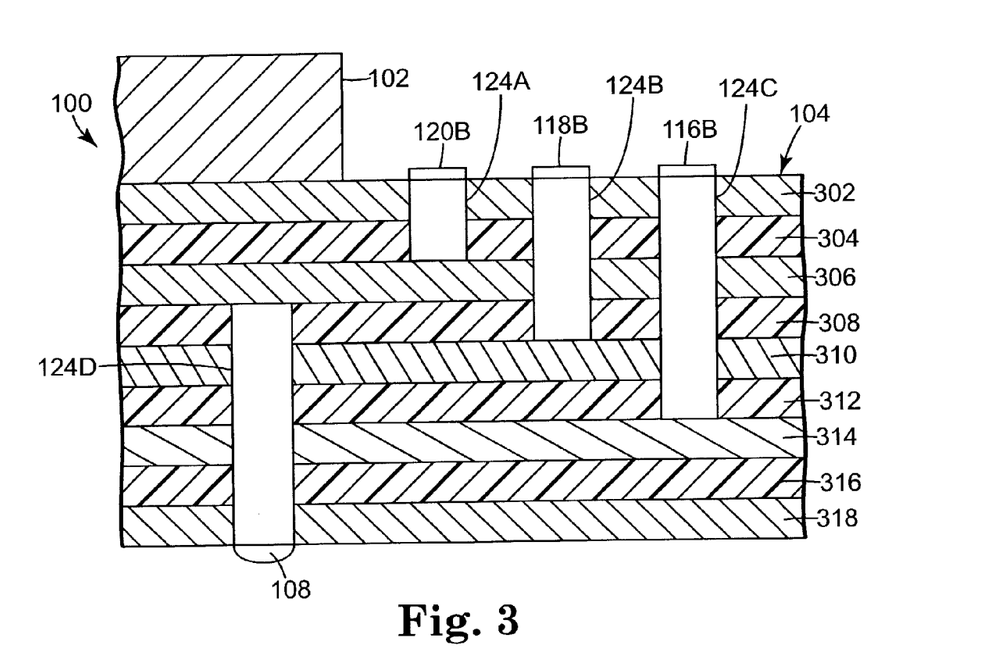
FIG. 3 illustrates a cross-sectional view of a portion of the semiconductor device shown in FIG. 1 according to one embodiment of the present invention.

A plurality of vias 124 are connected to power supply interconnects 116A and 118A, and ground interconnect 120A. Similar vias 124 are connected to interconnects 116B–116D, 118B–118D, and 120B–120D, but are not shown to simplify the illustration. As shown in FIG. 3, and described in further detail below with reference to FIG. 3, each via 124 extends into substrate 104, and is connected to an internal plane corresponding to the interconnect 116, 118, or 120, that the via 124 is connected to.

FIG. 3 illustrates a cross-sectional view of a portion of the semiconductor device 100 shown in FIG. 1 viewed from section lines 3–3 in FIG. 2. As shown in FIG. 3, substrate 104 includes a plurality of layers 302–318. Ball layer 318 is at the bottom of the multi-layer substrate 104. Solder balls 108 are formed at the bottom of the ball layer 318. Insulating layer 316 is formed on ball layer 318. VDDD power plane 314 is formed on insulating layer 316. Insulating layer 312 is formed on VDDD power plane 314. VDDC power plane 310 is formed on insulating layer 312. Insulating layer 308 is formed on VDDC power plane 310. Ground plane 306 is formed on insulating layer 308. Insulating layer 304 is formed on ground plane 306. Trace layer 302 is formed on insulating layer 302, and includes a plurality of conductive traces (see, e.g., traces 112A–112D, shown in FIG. 2).

Semiconductor die 102, ground interconnect 120B, VDDC power supply interconnect 118B, and VDDD power supply interconnect 116B, are formed on trace layer 302. Via 124A connects ground interconnect 120B to ground plane 306. Via 124B connects VDDC power supply interconnect 118B to VDDC power plane 310. Via 124C connects VDDD power supply interconnect 116B to VDDD power plane 314. Via 124D connects ground plane 306 to a solder ball 108.

In one embodiment, ground plane 306, VDDC power plane 310, and VDDD power plane 314, extend over substantially the entire length and width of substrate 104. Although only a single solder ball 108 is shown in FIG. 3 to simplify the illustration, in one form of the invention, a plurality of vias 124 are dropped down from ground plane 306, through layers 308–318, and are connected to solder balls 108. Likewise, a plurality of vias 124 are also dropped down from each of the power planes 310 and 314 and connected to solder balls 108. Clearance is provided for the vias 124 (and 114) that pass through one or more of the planes 306, 310, and 314, so that these vias are not connected to the planes that they pass through.

Figure 4:
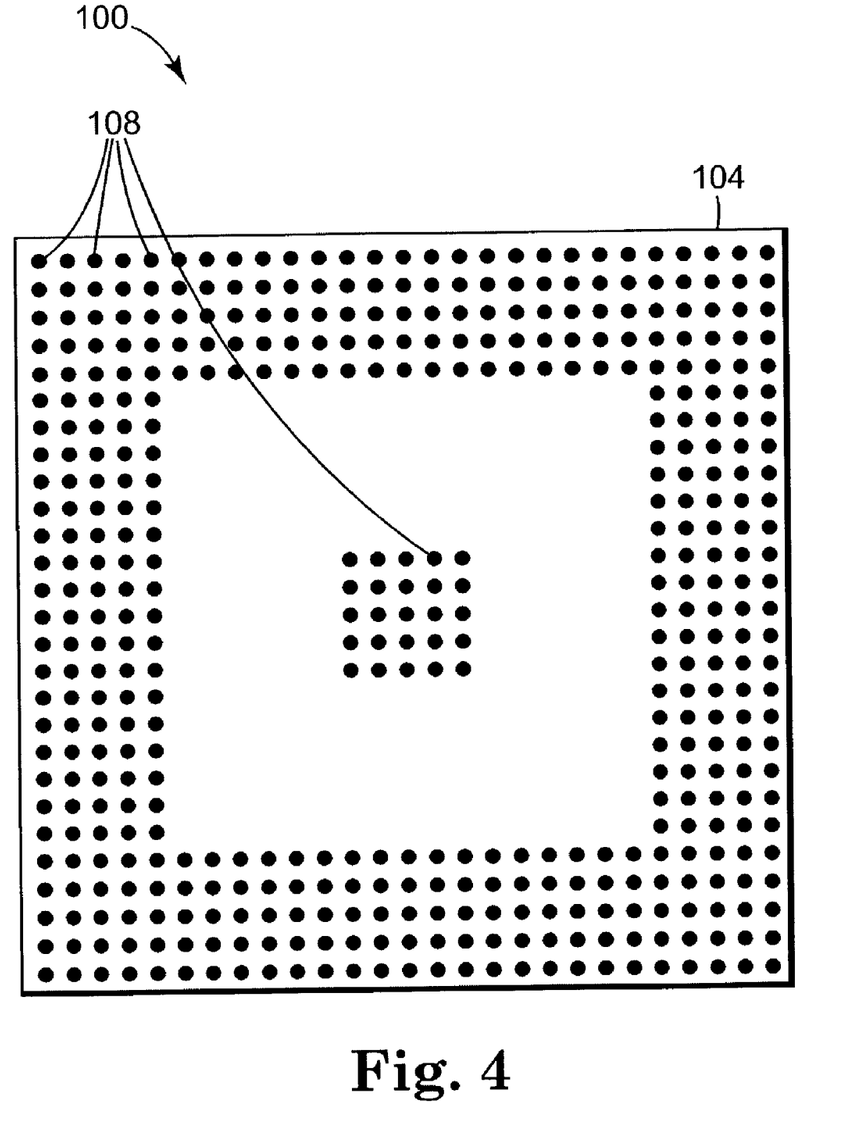
FIG. 4 illustrates a bottom view of the semiconductor device shown in FIG. 1 according to one embodiment of the present invention.

FIG. 4 illustrates a bottom view of the semiconductor device 100 shown in FIG. 1. A plurality of solder balls 108 is formed on the bottom surface of the substrate 104. The solder balls 108 include a five-by-five grid of solder balls near the center of the substrate 104, surrounded by five concentric square rings of solder balls. In one embodiment, each of the solder balls 108 in the inner five-by-five grid is connected to ground plane 306 by a via 124. A first plurality of the solder balls 108 in the inner square ring are each connected by a via 124 to the ground plane 306, a second plurality of the solder balls 108 in the inner square ring are each connected by a via 124 to the VDDC power plane 310, and a third plurality of the solder balls 108 in the inner square ring are each connected by a via 124 to the VDDD power plane 314. The solder balls 108 in the outer four square rings are each connected by a via 114 and trace 112 to one of the substrate signal pads 110, or to the ground plane 306 by a via 124.

To supply power to the die 102, a first power supply is connected to the solder balls 108 connected to the VDDC power plane 310, and a second power supply is connected to the solder balls 108 connected to the VDDD power plane 314. Current flows through the power planes 310 and 314, through the bond wires 106, through the power die pads 122, and into the die 102.

Figure 5:
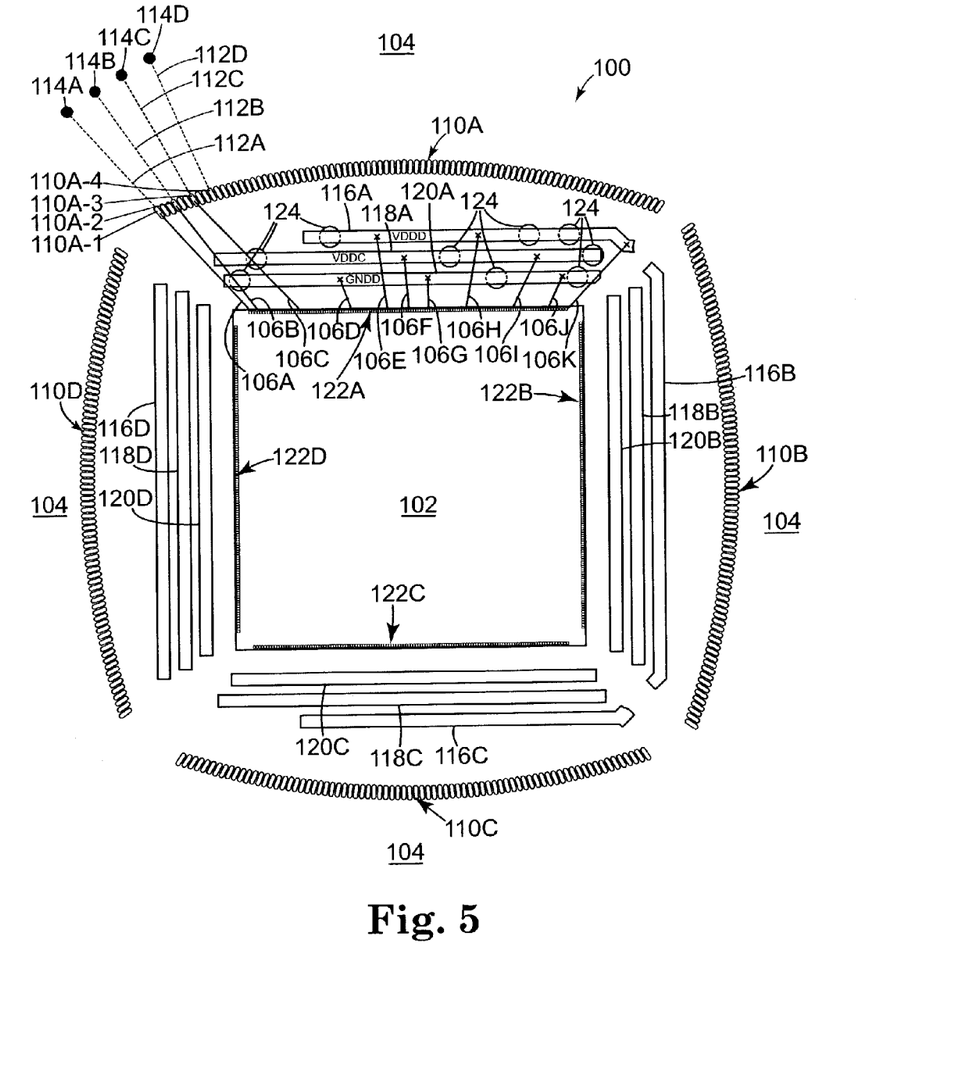
FIG. 5 illustrates a top view of the semiconductor device shown in FIG. 1 after being modified to provide power supply voltage monitoring according to one embodiment of the present invention.

FIG. 5 illustrates a top view of the semiconductor device 100 shown in FIG. 1 after being modified to provide power supply voltage monitoring according to one embodiment of the present invention. As shown in FIG. 5, the bond wire 106C that was connected to a power die pad 122 and to the VDDC power supply interconnect 118A, has been disconnected from the interconnect 118A and connected instead to substrate signal pad 110A-3. Substrate signal pad 110A-3 is connected by conductive trace 112C to via 114C. Via 114C extends through substrate 104, and is connected to one of the solder balls 108 (shown in FIG. 1) on the bottom surface of the substrate 104. Via 114C is not connected to any of the planes 306, 310, or 314. Thus, this modification connects one of the power die pads 122 to a solder ball 108 that is independent of the planes 306, 310, and 314, and provides the ability to use one of the power die pads 122 for voltage monitoring. By coupling a volt meter or other measuring device to the solder ball 108 connected to the bond wire 106C and the power die pad 122, an internal power supply voltage within the die 102 can be measured, or other electrical parameters (e.g., current) can be measured.

Volt meters typically have high resistance, so there is very little current that flows through the solder ball 108, the bond wire 106C, and the power die pad 122. Therefore, the voltage drop between the solder ball 108 and the power die pad 122 is approximately zero, and the measured voltage is the voltage of the power supply inside of the die.

Disconnecting the power die pad 122 (connected to bond wire 106C) from the VDDC power plane 310 circumvents the effect of the power plane 310, so that the internal die voltage may be measured. The power plane structure and the system of power die pads 122 typically supply a large current to the die 102, and a voltage drop exists between the solder balls 108 and the power die pads 122. Providing a power die pad 122 that is isolated from the power plane 310 avoids the voltage drop, and allows the internal voltage of the die 102 to be measured at the solder ball 108 (i.e., the voltage at the solder ball 108 will be substantially the same as the internal die power supply voltage).

Measuring the voltage at one of the solder balls 108 connected to the power plane 310 would not indicate the voltage inside the die 102, but rather it would indicate the voltage at the power plane 310. There is a large voltage drop between the power plane 310 and the interior of the die 102. Separating the bond wire 106C from the power plane 310 and connecting it to a separate connection (e.g., substrate signal pad 110A-3, which is coupled to an isolated solder ball 108 by trace 112C and via 114C) allows the voltage inside the die 102 to be measured.

Figure 6:
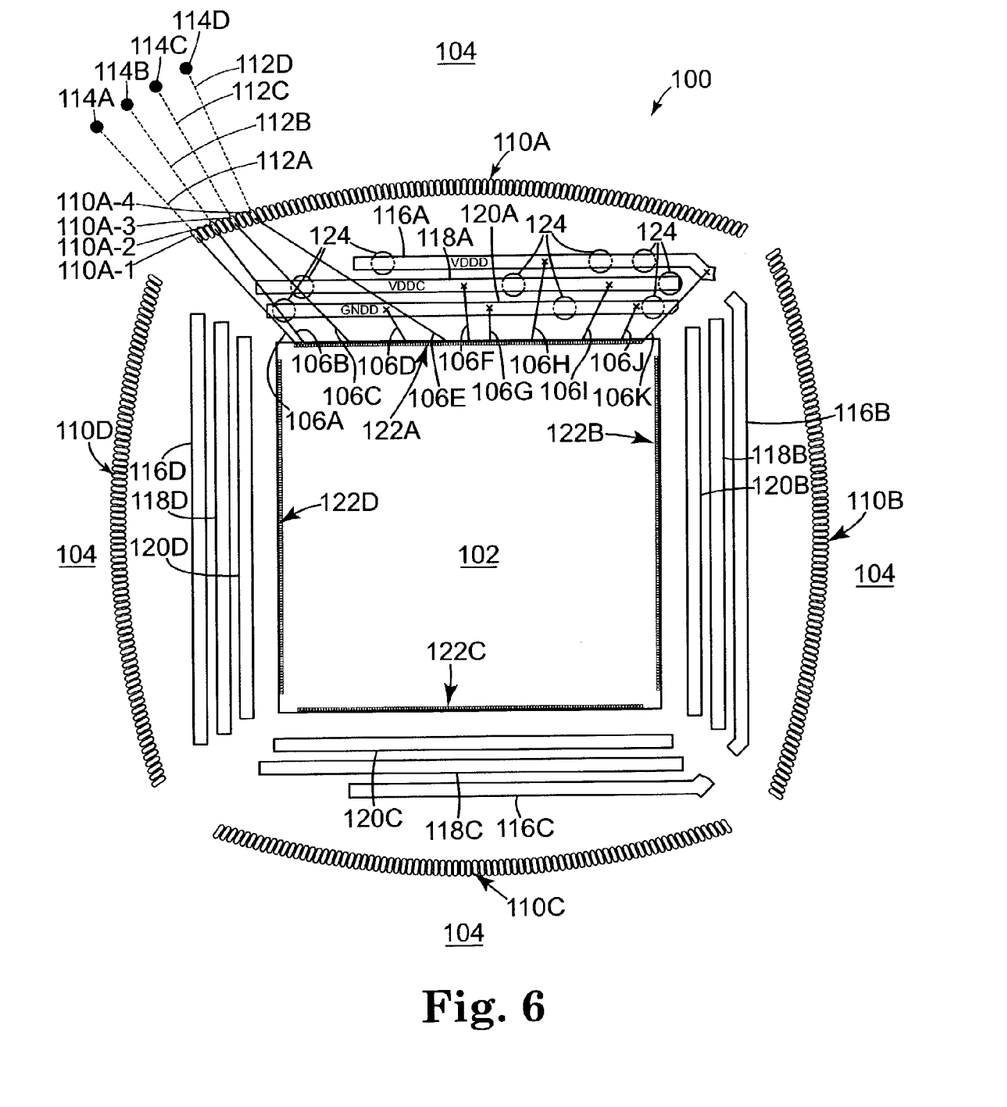
FIG. 6 illustrates a top view of the semiconductor device shown in FIG. 1 after being modified to provide voltage monitoring of multiple power supplies according to one embodiment of the present invention.

FIG. 6 illustrates a top view of the semiconductor device 100 shown in FIG. 1 after being modified to provide voltage monitoring of multiple power supplies according to one embodiment of the present invention. As shown in FIG. 6, the bond wire 106C that was connected to a power die pad 122 and to the VDDC power supply interconnect 118A has been disconnected from the interconnect 118A and connected instead to substrate signal pad 110A-3 in the same manner as described above with reference to FIG. 5. In addition, the bond wire 106E that was connected to a power die pad 122 and to the VDDD power supply interconnect 116A has been disconnected from the interconnect 116A and connected instead to substrate signal pad 110A-4. Substrate signal pad 110A-4 is connected by conductive trace 112D to via 114D. Via 114D extends through substrate 104, and is connected to one of the solder balls 108 (shown in FIG. 1) on the bottom surface of the substrate 104. Via 114D is not connected to any of the planes 306, 310, or 314. Thus, these modifications connect two of the power die pads 122 to two solder balls 108 that are each independent of the planes 306, 310, and 314, and provide the ability to use these power die pads 122 for voltage monitoring of both of the internal die power supply voltages (VDDC and VDDD). Similar modifications can be made to provide monitoring of internal die electrical parameters (e.g., voltage or current) for any number of power supplies.

Figure 7:
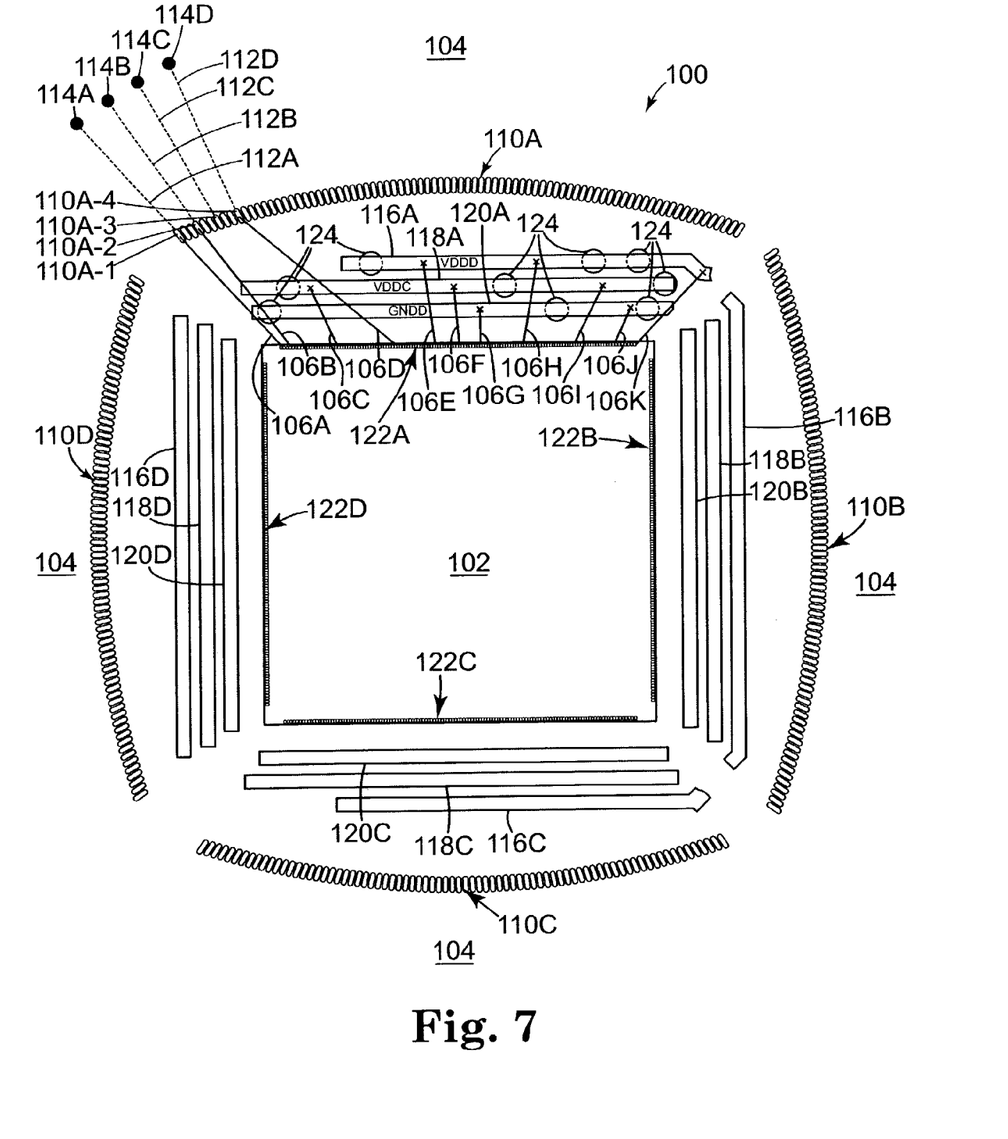
FIG. 7 illustrates a top view of the semiconductor device shown in FIG. 1 after being modified to provide ground voltage monitoring according to one embodiment of the present invention.

FIG. 7 illustrates a top view of the semiconductor device 100 shown in FIG. 1 after being modified to provide ground voltage monitoring according to one embodiment of the present invention. As shown in FIG. 7, the bond wire 106D that was connected to a ground die pad 122 and to the ground interconnect 120A, has been disconnected from the interconnect 120A and connected instead to substrate signal pad 110A-4. Substrate signal pad 110A-4 is connected by conductive trace 112D to via 114D. Via 114D extends through substrate 104, and is connected to one of the solder balls 108 (shown in FIG. 1) on the bottom surface of the substrate 104. Via 114D is not connected to any of the planes 306, 310, or 314. Thus, this modification connects one of the ground die pads 122 to a solder ball 108 that is independent of the planes 306, 310, and 314, and provides the ability to use one of the ground die pads 122 for ground voltage monitoring. By coupling a volt meter or other measuring device to the solder ball 108 connected to the bond wire 106D and the ground die pad 122, an internal ground voltage within the die 102 can be measured, or other electrical parameters (e.g., current) can be measured.

One form of the present invention provides a method for measuring an electrical parameter (e.g., voltage or current) inside a semiconductor die without adding new metal connections inside the die or in the package. In one embodiment, an existing power die pad is used for voltage sensing inside the die, rather than being used for sourcing current. One form of the present invention uses an existing pad design to sense internal die voltage, without the need to have a special dedicated design. In one embodiment, the power die pad used for sensing voltage is the same as the other power die pads. Power die pads are typically larger than dedicated pads that are specifically designed for voltage monitoring. One form of the present invention reduces the work typically involved in providing internal die voltage sensing by using an existing die pad that was originally designed for another purpose (e.g., power or ground).

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A method of modifying a semiconductor device to provide electrical parameter monitoring, the device including a semiconductor die and a package substrate, the substrate including a conductive plane, the die connected to the plane via a plurality of connection structures, each of the connection structures separately connecting the die to the plane, the method comprising:
(a) disconnecting a first one of the connection structures from the plane, wherein the disconnected first connection structure remains connected to a power pad or ground pad of the die; and
(b) connecting the disconnected first connection structure to an external package connection of the semiconductor device, thereby providing a capability to monitor an electrical parameter of the die via the external package connection.

2. The method of claim 1, wherein the conductive plane is a power plane.

3. The method of claim 2, wherein the power plane is coupled to power pads of the die via the plurality of connection structures, and is coupled to a plurality of power external package connection structures.

4. The method of claim 1, wherein the conductive plane is a ground plane.

5. The method of claim 4, wherein the ground plane is coupled to ground pads of the die via the plurality of connection structures, and is coupled to a plurality of ground external package connection structures.

6. The method of claim 1, wherein the plurality of connection structures are bond wires.

7. The method of claim 1, wherein the external package connection is a solder structure.

8. The method of claim 1, wherein the electrical parameter is an internal voltage of the die.

9. The method of claim 1, wherein the package substrate includes a plurality of conductive planes, and wherein the die is connected to each plane via a plurality of connection structures, the method further comprising:
   repeating steps (a) and (b) for each of the conductive planes.

10. A method of measuring an electrical parameter of a semiconductor die, the method comprising:
   (a) providing a semiconductor device including a semiconductor die and a package substrate, the substrate including a conductive plane, the die connected to the plane via a plurality of internal package connection structures, each of the internal package connection structures separately connecting the die to the plane;
   (b) disconnecting a first one of the internal connection structures from the plane, wherein the disconnected first internal connection structure is connected to a power pad or ground pad of the die;
   (c) connecting the disconnected first internal connection structure to a first external package connection structure of the semiconductor device; and
   (d) measuring an electrical parameter of the die at the first external connection structure.

11. The method of claim 10, wherein the conductive plane is a power plane.

12. The method of claim 10, wherein the conductive plane is a ground plane.

13. The method of claim 11, wherein the power plane is coupled to power pads of the die via the plurality of internal package connection structures, and is coupled to a plurality of power external package connection structures.

14. The method of claim 12, wherein the ground plane is coupled to ground pads of the die via the plurality of internal package connection structures, and is coupled to a plurality of ground external package connection structures.

15. The method of claim 10, wherein the plurality of internal package connection structures are bond wires.

16. The method of claim 10, wherein the first external package connection structure is a solder structure.

17. The method of claim 10, wherein the electrical parameter is an internal voltage of the die.

18. The method of claim 10, wherein the package substrate includes a plurality of conductive planes, and wherein the die is connected to each plane via a plurality of internal package connection structures, the method further comprising:
   repeating at least steps (b) and (c) for each of the conductive planes.

* * * * *